(12) United States Patent
Egitto et al.

(10) Patent No.: US 7,823,274 B2
(45) Date of Patent: Nov. 2, 2010

(54) METHOD OF MAKING MULTILAYERED CIRCUITIZED SUBSTRATE ASSEMBLY

(75) Inventors: Frank D. Egitto, Binghamton, NY (US);
Voya R. Markovich, Endwell, NY (US);
Luis J. Matienzo, Endicott, NY (US)

(73) Assignee: Endicott Interconnect Technologies, Inc., Endicott, NY (US)

(*) Notice: Subject to any disclaimer, the term of this patent is extended or adjusted under 35 U.S.C. 154(b) by 96 days.

(21) Appl. No.: 11/905,188

(22) Filed: Sep. 28, 2007

(65) Prior Publication Data

US 2008/0022520 A1 Jan. 31, 2008

Related U.S. Application Data

(62) Division of application No. 11/177,442, filed on Jul. 11, 2005, now Pat. No. 7,342,183.

(51) Int. Cl.
*H05K 3/46* (2006.01)
(52) U.S. Cl. ............................ 29/830; 29/846; 174/262
(58) Field of Classification Search ......... 174/256–259, 174/262–266; 361/792–796; 29/830, 831, 29/846, 851, 852; 428/156
See application file for complete search history.

(56) References Cited

U.S. PATENT DOCUMENTS

| 5,026,624 A | 6/1991 | Day et al. |
| 5,300,402 A | 4/1994 | Card, Jr. et al. |
| 5,891,283 A | 4/1999 | Tani et al. |
| 6,120,708 A | 9/2000 | Ohshita et al. |
| 6,528,145 B1 * | 3/2003 | Berger et al. ............... 428/156 |
| 6,641,898 B2 | 11/2003 | Yazaki et al. |
| 6,762,496 B2 | 7/2004 | Yamamoto et al. |
| 6,809,269 B2 | 10/2004 | Fuller, Jr. et al. |
| 6,815,837 B2 | 11/2004 | Alcoe |
| 6,828,514 B2 | 12/2004 | Chan et al. |
| 2002/0050586 A1 | 5/2002 | Oshita et al. |

* cited by examiner

*Primary Examiner*—A. Dexter Tugbang
*Assistant Examiner*—Livius R Cazan
(74) *Attorney, Agent, or Firm*—Mark Levy; Hinman, Howard & Kattell; Lawrence R. Fraley

(57) ABSTRACT

A method of making a multilayered circuitized substrate assembly which includes bonding at least two circuitized substrates each including at least one layer of high temperature dielectric material, one of these layers in turn including at least one thru-hole therein having therein a quantity of a a low temperature conductive paste, the paste including an organic binder component and at least one metallic component. The flakes of the metallic component are sintered during the bonding to form a conductive path through the dielectric of one of the substrates.

4 Claims, 3 Drawing Sheets

METHOD OF MAKING MULTILAYERED CIRCUITIZED SUBSTRATE ASSEMBLY

CROSS REFERENCE TO CO-PENDING APPLICATION

This application is a divisional application of Ser. No. 11/177,442, filed Jul. 11, 2005, now U.S. Pat. No. 7,342,183, and entitled "Circuitized Substrate With Sintered Paste Connections, Multilayered Substrate Assembly, Electrical Assembly and Information Handling system Utilizing Same". This application defines a circuitized substrate which includes a high temperature dielectric material in combination with a low temperature conductive paste, the paste including an organic binder component and at least one metallic component. The flakes of the metallic component are sintered to form a conductive path through the dielectric when the dielectric is used as a layer in the substrate.

TECHNICAL FIELD

This invention relates to organic circuitized substrates and particularly to those used in multilayered circuit boards, chip carriers, and the like, and more particularly to processes for manufacturing same. More particularly, the invention relates to methods of making substrates which are to be used in such final products so as to provide same with enhanced connectivity between conductive layers.

BACKGROUND OF THE INVENTION

Multilayered printed circuit boards (PCBs), laminate chip carriers, and the like organic products permit formation of multiple circuits in a minimum volume or space. These typically comprise a stack of electrically conductive layers of signal, ground and/or power planes (lines) separated from each other by a layer of organic dielectric material. The lines are often in electrical contact with each other by plated holes passing through the dielectric layers. The plated holes are often referred to as "vias" if internally located, "blind vias" if extending a predetermined depth within the board from an external surface, or "plated-thru-holes" (PTHs) if extending substantially through the board's full thickness. By the term "thru-hole" as used herein is meant to include all three types of such board openings.

Conventional methods for fabricating such PCBs, chip carriers and the like typically comprise fabrication of separate inner-layer circuits (circuitized layers), which are formed by coating a photosensitive layer or film over a copper layer of a copper clad inner layer base material. The organic photosensitive coating is imaged, developed and the exposed copper is etched to form conductor lines. After etching, the photosensitive film is stripped from the copper leaving the circuit pattern on the surface of the inner-layer base material. This processing is also referred to as photolithographic processing in the PCB art and further description is not deemed necessary. Following the formation of individual inner-layer circuits, a multilayer stack is formed by preparing a lay-up of inner-layers, ground planes, power planes, etc., typically separated from each other by a dielectric, organic pre-preg typically comprising a layer of glass (typically fiberglass) cloth impregnated with a partially cured material, typically a B-stage epoxy resin. Such an organic material is also referred to in the industry as "FR-4" dielectric material. The top and bottom outer layers of the stack usually comprise copper clad, glass-filled, epoxy planar substrates with the copper cladding comprising exterior surfaces of the stack. The stack is laminated to form a monolithic structure using heat and pressure to fully cure the B-stage resin. The stack so formed typically has metal (usually copper) cladding on both of its exterior surfaces. Exterior circuit layers are formed in the copper cladding using procedures similar to the procedures used to form the inner-layer circuits. A photosensitive film is applied to the copper cladding. The coating is exposed to patterned activating radiation and developed. An etching solution such as cupric chloride is then used to remove copper bared by the development of the photosensitive film. Finally, the remaining photosensitive film is removed to provide the exterior circuit layers.

Electrically conductive thru-holes (or interconnects) are used to electrically connect individual circuit layers within the structure to each other and to the outer surfaces and typically pass through all or a portion of the stack. Thru-holes may be formed prior to the formation of circuits on the exterior surfaces by drilling holes through the stack at appropriate locations. Alternatively, such holes may be formed within the individual circuitized layers prior to incorporation within the multi-layered structure and final lamination thereof. In both methods, the bare hole walls are usually subjected to at least one pre-treatment step after which the walls are catalyzed by contact with a plating catalyst and metallized, typically by contact with an electro-less or electrolytic copper plating solution. If the thru-holes are PTHS, interconnections are thus formed between selected ones of the circuitized layers of the multilayered final product which have one or more conductive lines or elements in contact with the inner conductive layer of the PTHS. If the thru-holes are individually formed within selected layers and then coupled to one another during product stacking, connectivity is accomplished preferably using a conductive paste or the like. Such pastes are known to include a highly conductive metal such as silver in the form of flakes. Following formation of the conductive thru-holes in multilayered structures such as PCBS in which the thru-holes are provided as PTHS, exterior circuits (outer-layers) are formed using the procedure described above. Such external formation may also occur when stacking layers already having thru-holes formed therein, albeit it is possible to form the two outer conductive layers prior to stacking and lamination.

After construction, chips and/or other electrical components are mounted at appropriate locations on the exterior circuit layers of the multilayered stack. In some examples, such components are mounted and electrically coupled using solder ball technology, one form of which is referred to in the industry as ball grid array (BGA) technology. For PCBS, these components may include capacitors, resistors, and even chip carriers. For chip carriers having multilayered substrates, a chip is often solder bonded to the carrier laminate substrate's upper surface and the carrier is in turn solder bonded to an underlying substrate, typically a PCB. In either form (PCB or chip carrier), the components are in electrical contact with the circuits within the structure through the conductive thru-holes, as desired. The solder pads are typically formed by coating an organic solder mask coating over the exterior circuit layers. The solder mask may be applied by screen coating a liquid solder mask coating material over the surface of the exterior circuit layers using a screen having openings defining areas where solder mount pads are to be formed. Alternatively, a photoimageable solder mask may be coated onto the exterior surfaces and exposed and developed to yield an array of openings defining the pads. The openings are then coated with solder using processes known to the art such as wave soldering. Examples of organic products such as defined above are shown in the patents listed below, as are substrates of the non-organic (ceramic) type.

In U.S. Pat. No. 6,828,514, issued Dec. 7, 2004, there is defined a multilayered PCB including two multilayered portions, one of these able to electrically connect electronic components mounted on the PCB to assure high frequency connections there-between. The PCB further includes a conventional PCB portion to reduce costs while assuring a structure having a satisfactory overall thickness for use in the PCB field. Coupling is also possible to the internal portion from these components. This patent is assigned to the same Assignee as the instant invention.

In U.S. Pat. No. 6,815,837, issued Nov. 9, 2004, there is defined an electronic package (e.g., a chip carrier) and information handling system utilizing same wherein the package substrate includes an internally conductive layer coupled to an external pad and of a size sufficiently large enough to substantially prevent cracking, separation, etc. of the pad when the pad is subjected to a predetermined tensile pressure. This patent is also assigned to the same Assignee as the instant invention.

In U.S. Pat. No. 6,809,269, issued Oct. 26, 2004, there is defined a circuitized substrate assembly and method for making same wherein the assembly includes individual circuitized substrates bonded together. The substrates each include at least one opening, only one of which is substantially filled with a conductive paste prior to bonding. Once bonded, the paste is also partially located within the other opening to provide an effective electrical connection therewith. One example of a product using this technology is a chip carrier. This patent is also assigned to the same Assignee as the instant invention.

In U.S. Pat. No. 6,762,496, issued Jul. 13, 2004, there is described a sintered aluminum nitride substrate which has a via hole and an internal electrically conductive layer with, allegedly, high thermal conductivity and high adhesion strength between the sintered aluminum nitride substrate and the internal electrically conductive layer or the via hole. The substrate consists of an internal electrically conductive layer, at least one electrically conductive via hole formed between the internal electrically conductive layer and at least one surface of the substrate, wherein the thermal conductivity of the aluminum nitride sintering product at 25 degrees Celsius (C.) is described as being 190 W/mK or more, with a corresponding adhesion strength between the aluminum nitride sintering product and the internal electrically conductive layer also mentioned.

In U.S. Pat. No. 6,641,898, issued Nov. 4, 2003, there is described a heated and pressed printed wiring board which is made by filling "via" holes formed in layers of insulating film of the wiring board with an interlayer conducting material. The insulating film is stacked with conductor patterns, and each conductor pattern closes a hole. The interlayer conducting material forms a solid conducting material in the holes after a heating a pressing procedure. The solid conducting material includes two types of conducting materials. The first type of conducting material includes a metal, and the second type of conductive material includes an alloy formed by the metal and conductor metal of the conductor patterns. The first type of conducting material includes indium particles, tin and silver wherein tin accounts for approximately 20-80 weight percentage of the solid conductive material, and the second type of conducting material includes an alloy comprised of the solid conductive material and the conductor metal. The conductor patterns are electrically connected reliably without relying on mere mechanical contact.

In Published Patent Application 2002/0050586, issued May 2, 2002, there is described an electro-conductive paste for use in making ceramic substrates containing from about 5 to 18 percent by weight of an organic vehicle consisting of a solvent and a binder, from about 80 to 93 percent by weight of an electro-conductive metal powder in a spherical or granular shape and with a particle diameter in the range of about 0.1 to 50 microns, and from about 2 to 10 percent by weight of a resin powder with a particle diameter in the range of about 0.1 to 50 microns which is insoluble in the solvent and has a low level of water absorption. This paste may be used for forming via hole conductors to be converted to external electrode terminals for the resulting ceramic products.

In U.S. Pat. No. 6,120,708, issued Sep. 19, 2000, there is described a conductive paste for forming via-holes in a ceramic substrate, which paste contains about 80-94 weight percentage spherical or granular conductive metal powder having a particle size of about 0.1-50 microns, 1-10 weight percentage resin powder which swells in a solvent contained in the conductive paste and has a particle size of about 0.1-40 microns, and about 5-19 weight percentage of an organic vehicle. The paste allegedly hardly generates cracks during firing to thereby attain excellent reliability in electric conduction and which can provide a via-hole or through hole having excellent solderability and platability in a ceramic substrate structure.

In U.S. Pat. No. 5,891,283, issued Apr. 6, 1999, there is described a conductive paste for use in forming ceramic substrates in which the composition consists of an organic vehicle, copper powder and an organo-metallic resinate which includes, as the metal, at least one metal selected from the group consisting of Pt, Ni and Bi. The amount of the metal component in the organo-metallic resinate is in the range of about 0.1 to 5 weight percentage with respect to the total amount of the copper power and the metal component. The copper powder has preferably an average diameter in the range of about 2 to 30 microns.

Complexity of the above organic products (those including organic dielectric layers, including the aforementioned PCBS and laminate chip carriers) has increased significantly over the past few years, especially as such products increase in demand over those of the ceramic variety. For example, PCBs for mainframe computers may have as many as thirty-six layers of circuitry or more, with the complete stack having a thickness of as much as about 0.250 inch (250 mils). Laminate chip carriers, in turn, may have as many as fifteen circuit layers as part thereof. Such organic products are known with three or five mil (a mil being one thousandth of an inch) wide signal lines and twelve mil diameter thru-holes, but for increased circuit densification in many of today's products, the industry is attempting to reduce signal lines to a width of two mils or less and thru-hole diameters to two mils or less. Such high densification understandably mandates the most efficient means of interconnecting the respective layers in the smallest space available and using the best materials possible. As defined herein, the present invention is able to accomplish this.

It is believed that a circuitized substrate having organic dielectric material as part thereof which is able to provide enhanced interconnection between various conductive portions (e.g., layers) thereof would constitute a significant advancement in the art. It is further believed that a method of making same, as well as an electronic assembly and an information handling system using same would constitute a significant art advancement.

OBJECTS AND SUMMARY OF THE INVENTION

It is, therefore, a primary object of the invention to enhance the circuitized substrate art.

It is another object of the invention to provide a method of making a multilayered circuitized substrate assembly including two or more circuitized substrates bonded together to form a larger structure which can be used, e.g., as a PCB or chip carrier.

It is yet another object of the invention to provide a method of making an electrical assembly adapted for utilizing the circuitized substrates defined herein as part thereof.

According to another aspect of the invention, there is provided a method of making a multilayered circuitized substrate assembly, the method comprising providing a first circuitized substrate including at least one high temperature dielectric layer having first and second opposing surfaces, at least one opening within this dielectric layer extending from the first opposing surface to the second opposing surface, positioning a quantity of low temperature conductive paste within the opening, the low temperature conductive paste including an organic binder component and at least one metallic component including a plurality of flakes, and bonding a second circuitized substrate also including at least one high temperature dielectric layer having first and second opposing surfaces to the first circuitized substrate such that the flakes within the low temperature conductive paste within the opening will be sintered and of such a density so as to form at least one electrical path through the paste from the first opposing surface of the high temperature dielectric layer of the first circuitized substrate to the second opposing surface of the high temperature dielectric layer of the first circuitized substrate.

According to still another aspect of the invention, there is provided a method of making an electrical assembly including the multilayered circuitized substrate assembly made in accordance with the teachings herein.

BEST MODE FOR CARRYING OUT THE INVENTION

Figure 1:
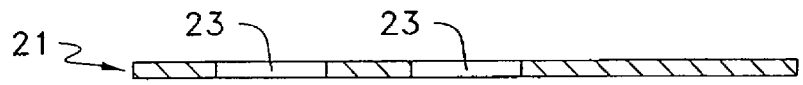
FIGS. 1-5 are side elevational views, in section, showing the steps of making a circuitized substrate according to one embodiment of the invention.

For a better understanding of the present invention, together with other and further objects, advantages and capabilities thereof, reference is made to the following disclosure and appended claims in connection with the above-described drawings. Like figure numbers will be used from figure to figure to identify like elements in these drawings.

The broadest definition of the term "circuitized substrate" as used herein is meant to include a substrate having at least one (and preferably more) dielectric layer(s) and at least one (and preferably more) opening(s) therein extending through the dielectric layer thickness with a quantity of conductive paste therein. In an alternative embodiment, the opening can be a thru-hole (as defined above) such as a PTH with the paste therein. In a still further embodiment, the substrate as so defined may further include one or more conductive layers as part thereof. Known examples of substrates such as those described in one or more of the foregoing patents typically include PCBS or chip carriers with several dielectric layers made of one or more of the following dielectric materials: fiberglass-reinforced epoxy resin ("FR-4"), polytetrafluoroethylene (Teflon), polyimide, polyamide, cyanate resin, photo-imageable material, and other like materials. These known structures include several conductive layers each being a metal layer (e.g., power, signal and/or ground) comprised of suitable metallurgical materials such as copper, but may include or comprise additional metals (e.g., nickel, aluminum, etc.) or alloys thereof. Further examples will be described in greater detail herein-below. An example of a particularly useful photo-imageable dielectric is ASMDF (Advanced Soldermask Dry Film). This composition, which is further described in U.S. Pat. No. 5,026,624, which issued Jun. 25, 1991, and U.S. Pat. No. 5,300,402, which issued Apr. 25, 1994, includes a solids content of from about 86.5 to about 89%, such solids comprising: about 27.44% PKHC, a phenoxy resin; 41.16% of Epirez 5183, a tetrabromobisphenol A; 22.88% of Epirez SU-8, an octafunctional epoxy bisphenol A formaldehyde novolac resin; 4.85% UVE 1014 photo-initiator; 0.07% ethylviolet dye; 0.03% FC 430, a fluorinated polyether nonionic surfactant from 3M Company; 3.85% Aerosil 380, an amorphous silicon dioxide from Degussa to provide the solid content. A solvent is present from about 11 to about 13.5% of the total photo-imageable dielectric composition. As defined herein, the present invention represents a departure from the use of many such known materials by providing a substrate which includes at least one (and possibly more) dielectric layer(s) which is referred to as being a high temperature dielectric layer. By the term "high temperature" when defining a dielectric layer as used herein is meant such a layer which can withstand temperatures greater than about 350 degrees C. for a time period long enough to enable successful lamination of the layer with other layers/substrates to occur, usually a period of about two hours, without the dielectric material breaking down into low molecular weight fragments. One example of such material known today is sold under the product name "RO2800" by Rogers Corporation, Rogers, Conn. "RO2800" is a trademark of the Rogers Corporation.

By the term "conductive paste" as used herein is meant an electrically conductive paste composition adapted for use in holes or openings of substrates and including at least one organic binder component and at least one metallic component. By the term "low temperature" as used herein when defining conductive pastes is meant a paste wherein the organic binder breaks down into low molecular weight fragments at a temperature greater than about 330 degrees C. This temperature is understood to be below the above temperature the invention's dielectric material is able to withstand for the defined period during lamination. At least one example of such a conductive paste is presented below.

By the term "electrical assembly" is meant at least one circuitized substrate as defined herein in combination with at least one electrical component (defined below) electrically coupled thereto and forming part of the assembly. Examples of known such assemblies include chip carriers which include a semiconductor chip as the electrical component, the chip usually positioned on the substrate and coupled to wiring (e.g., pads) on the substrate's outer surface or to internal conductors using one or more thru-holes. Another example is a printed circuit board, albeit if using the teachings of this invention, such a structure will include typically one such circuitized substrate in combination with at least one additional substrate having, e.g., two or more conductive layers and thru-holes therein, the resulting structure in turn including one or more electrical components coupled thereto. Further definition is provided below.

By the term "electrical component" as used herein is meant components such as semiconductor chips and the like which are adapted for being positioned on the external conductive surfaces of circuitized substrates and electrically coupled to the substrate for passing signals from the component into the substrate whereupon such signals may be passed on to other components, including those mounted also on the substrate, as well as other components such as those of a larger electrical system which the substrate forms part of.

By the term "information handling system" as used herein shall mean any instrumentality or aggregate of instrumentalities primarily designed to compute, classify, process, transmit, receive, retrieve, originate, switch, store, display, manifest, measure, detect, record, reproduce, handle or utilize any form of information, intelligence or data for business, scientific, control or other purposes. Examples include personal computers and larger processors such as servers, mainframes, etc.

FIGS. 1-5 illustrate the steps of making a circuitized substrate according to one aspect of the invention. In FIG. 1, a conductive layer 21, preferably a copper sheet, is etched (e.g., using an etching solution including cupric chloride) to define a plurality of openings 23 therein. Although only two openings are depicted in FIG. 1, this is meant to be representative only. In one example, a total of 2500 openings may be provided within a rectangular layer having dimensions of about 52.5 millimeters (mm) wide by about 52.5 mm long, and a thickness of about 0.0356 mm. Openings 23, in the embodiment shown here, are meant to form "clearance" openings in the finished substrate, such that conductive openings (defined below) may be formed within the substrate and extend through the substrate without electrically contacting the conductive layer 21. "Clearance" openings are known in the PCB art and further definition is not deemed necessary.

Figure 2:
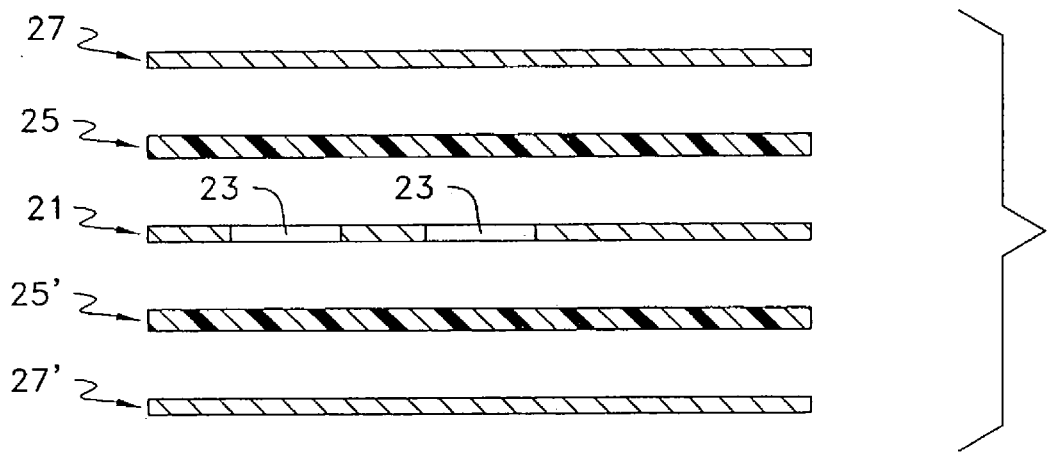

As shown in FIG. 2, layer 21 is then aligned with opposing dielectric layers 25 and 25', in addition to opposing conductive layers 27 and 27'. Layers 27 and 27' are also preferably copper and may possess the same dimensions as layer 21, although the thickness of said layers may be different than that of layer 21, with one example of such thickness being about 0.012 mm. Significantly, each of the dielectric layers 25 and 25' is a high temperature dielectric layer, meaning that each can withstand temperatures greater than about 350 degrees C. for a time period long enough to enable successful lamination of the layers with other elements which are to form the substrate, or, in one embodiment, a multilayered substrate assembly comprised of two or more substrates laminated together. A preferred example of such material known today is the aforementioned "RO2800" dielectric material sold by Rogers Corporation "RO2800" is a polytetrafluorethylene (PTFE) composite material having a low dielectric constant and includes fused silica as one of the composition elements. It is rated with 0% water solubility and has a specific gravity of 2.1. Each layer 25 and 25' includes an initial thickness of about 0.05 mm. The aligned subassembly of FIG. 2 is now laminated together to form a "sandwich", as now seen in FIG. 3. Conventional lamination processing and equipment may be used. In one example, the five layers shown in FIG. 2 may be laminated at a temperature of about 365 degrees C. using a pressure of about 2000 pounds per square inch (PSI) for a time period of about 125 minutes.

Figure 3:
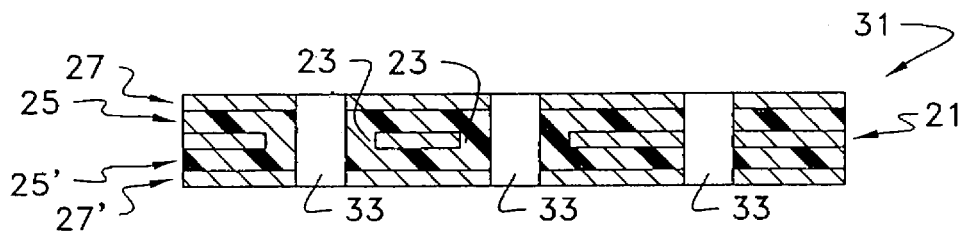

The resulting laminated structure 31 is shown in FIG. 3. When compressed from layers having the above initial thickness dimensions, the laminated structure 31 of FIG. 3 will possess a total thickness of about 0.160 mm. After lamination, a plurality of openings 33 are formed within structure 31, preferably using a laser or mechanical drills. In one example, a total of 5600 openings may be provided, each preferably having a diameter of about 0.050 mm. It is noted that the dielectric material of layers 25 and 25' has extended within the clearance openings 23 as a result of the lamination step, such that this material now forms the side walls of the portion of the openings 33 located within layer 21. Further, it is noted that openings 23 have the conductive material of layers 27 and 27' for the walls in the outer portions of the laminated structure. FIG. 3 also shows that an opening 33 is formed within the structure at a location distant from the openings 23 such that the opening (to the right in FIG. 3) will physically contact layer 21. Thus, this particular opening 33 will include side walls of conductive material at layer 21, unlike the other two openings to the left in FIG. 3. As explained below, this represents an alternative means of providing electrical coupling of selected elements of the invention.

Figure 4:
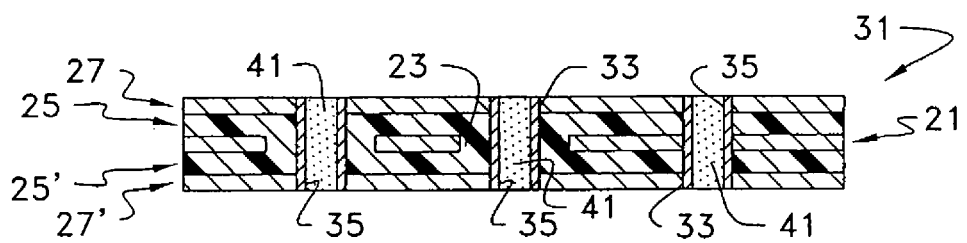

In FIG. 4, each of the openings 33 is plated, preferably with copper, to form inner conductive layers 35. A preferred method of accomplishing this is to use a "flash" plating of electro-less copper. This plating process is typically comprised of four operations: cleaning; activation; acceleration; and deposition. During the cleaning phase, organic contaminants are removed from exposed metal surfaces. Activation includes a dip in a catalyst bath typically including hydrochloric acid and possibly tin or sodium chloride, and activation in a bath of hydrochloric acid, tin chloride and palladium chloride. The tin (Sn+2) ion reduces the palladium (Pd+2) to palladium, which is deposited on the substrate. Remaining Sn+2 and Sn+4 are selectively removed by an accelerator such as fluoboric or sulfuric acid with hydrazine. Key elements of the electro-less copper chemistry include sodium hydroxide, formaldehyde, EDTA (or other chelater) and a copper salt. During the complex reaction with the palladium as a catalyst, the formaldehyde reduces the copper ions to metallic copper. Each layer 35 has a thickness of only about 0.001 mm. It is seen in FIG. 4 that the plated opening to the right is electrically coupled to inner layer 21 because the plating is deposited on the exposed areas of layer 21. The plating of the other two openings to the left in FIG. 4 are in contact with the defined dielectric material of layers 25 and 25' in addition to the outer conductive layers 27 and 27'. The right opening 33 is also in contact with the outer conductive layers 27 and 27'. It is to be understood that forming plated layers 35 is an optional step in forming a substrate as defined herein, but is preferred to further assure sound conductive paths in these portions of the structure.

The next step, as also shown in FIG. 4, involves the deposition of conductive paste 41 within each of the plated openings. Such deposition may be accomplished using screen coating techniques or using a needle dispenser. Significantly, the conductive paste is a low temperature paste meaning that the organic binder component which forms part of the paste composition breaks down into low molecular weight fragments at a temperature greater than about 330 degrees C. This temperature is understood to be below the above temperature the above-defined dielectric material is able to withstand during the periods during lamination defined herein. As such, the metallic component (preferably silver flakes) becomes sintered during the lamination process as a result of the high temperature of same. The sintering in turn forms an enhanced outer conductive layer on the silver flakes such that, when in the density associated with such a paste composition, will form several electrical paths through the paste and thus effectively interconnect conductive elements such as circuit pads or lines in the manner taught herein. Other metallic components for the conductive paste of the invention include copper and aluminum. In one embodiment of the invention, a conductive paste sold under the product name "DA-5915" by Engineered Materials Systems of Delaware, Ohio, may be used. This paste includes about eighty-eight percent by weight silver flakes and about twelve percent by weight of an anhydride epoxide as the organic binder, and is described as having a decomposition temperature of approximately 340 degrees C., which, when considering the above dielectric material, is about ten degrees C. less than the 350 degrees C. temperature the dielectric can withstand during lamination. Sintering of the silver flakes will thus occur without dielectric material decomposition (break down) during lamination when the structure taught herein is bonded (laminated) together with other elements to form a multilayered circuitized substrate assembly, defined in greater detail in FIG. 6 below.

Figure 5:
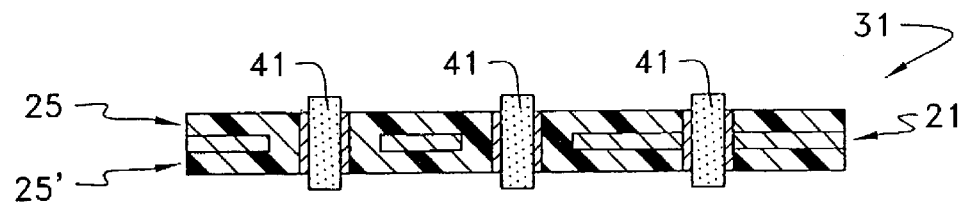

In FIG. 5, the structure of FIG. 4 is now subjected to an etching step in which all of the external metal of layers 27 and 27' is removed, in addition to the upper and lower portions of the plated layers of the openings which were in contact with layers 27 and 27'. Projecting portions of conductive paste 41 remain, as shown. The structure shown in FIG. 5 is thus a circuitized substrate in the broadest sense of the invention, meaning that it includes at least one layer of high temperature dielectric with at least one opening having a low temperature conductive paste therein. This substrate is thus able to provide a plurality of electrical connections through the paste using the sintered electrical paths formed within the paste when the paste is finally sintered (e.g., when the FIG. 5 structure is laminated together with other substrates as defined below). These paths understandably run, at a minimum, from the upper surface to the lower surface of the structure, and thus the length of each opening since the paste fully occupies each opening. Such a connection may occur in less than the full length should the openings each have the defined plated layers therein and less than a full length of paste is used. Preferably, however, the paste of the invention fully occupies each opening, and, when the structure is as shown as in FIG. 5, projects a small distance from the external surfaces in the manner indicated.

Figure 6:
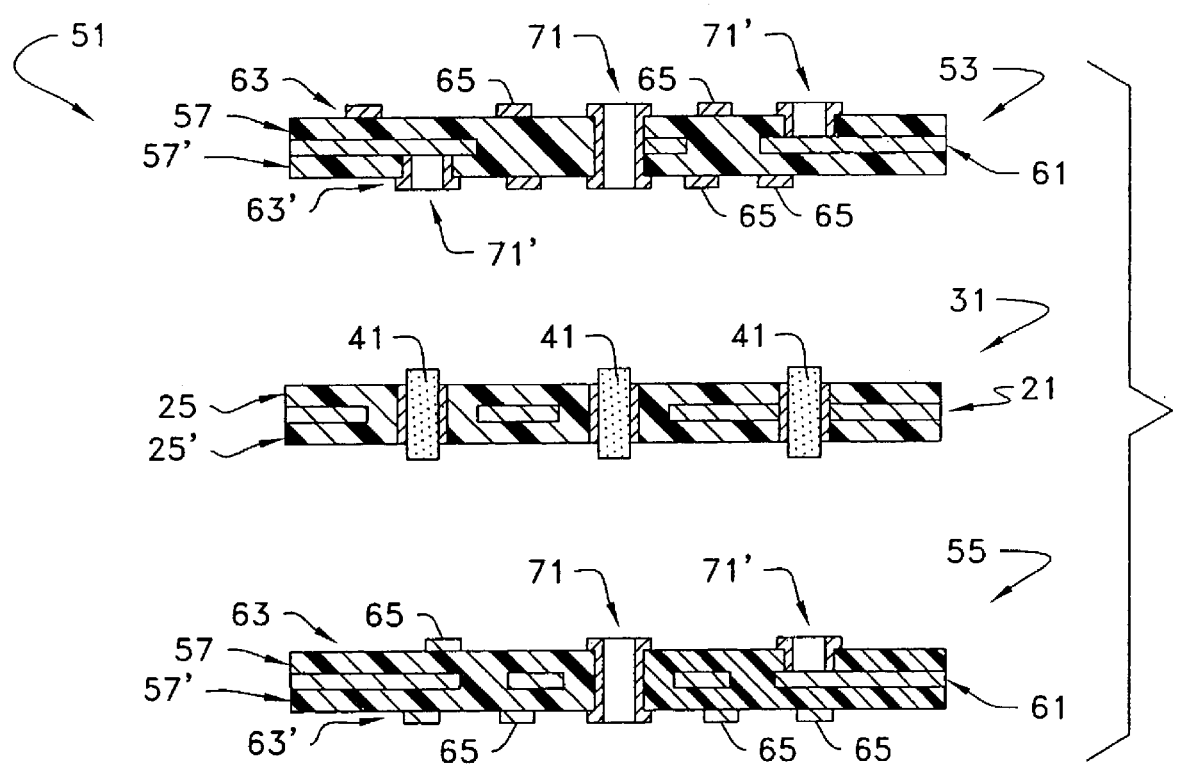
FIG. 6 is an exploded, side elevational view, in section, showing the various parts of a multilayered circuitized substrate assembly according to one embodiment of the invention.

FIG. 6 represents one example of a multilayered circuitized substrate assembly 51 according to one embodiment of the invention. Assembly 51 utilizes the circuitized substrate of FIG. 5 as an interconnector to electrically couple two opposing substrates 53 and 55. Each substrate 53 and 55 may include at least one dielectric layer 57 (preferably two, including a second layer 57') with at least one conductive layer 61 (preferably two additional outer conductive layers 63 and 63' for each, one or both of these added layers being in the form of a signal layer having a plurality of signal lines (traces) 65 as part thereof. The dielectric material for each of the dielectric layers of the substrates 53 and 55 is also a high temperature dielectric and preferably the same material as that used for layers 25 and 25' of the interconnecting substrate defined above. Substrates 53 and 55 may also include a plurality of thru-holes, including in the form of a PTH 71 or a "blind" via 71', for being electrically coupled to designated conductive elements of the substrates. The three substrates shown in FIG. 6 are aligned to assure subsequent electrical connection between corresponding conductive elements (especially between the projecting paste 41 segments and corresponding, facing conductive elements of the opposing substrates). For example, the paste 41 to the right of substrate 31 is shown to align with the corresponding lower conductive pad 65 on the undersurface of upper substrate 53, while the lower projecting segment of this same paste is aligned to connect to the upper conductive portion of a "blind" via (thru-hole) 71' located on the upper surface of the lower substrate 55. A sound electrical path is thus formed between pad 65 on upper substrate 53 and the inner conductive layer 61 of lower substrate 55 when the three substrates of FIG. 6 are laminated together. Several other electrical paths are readily discernible from the structure formed using these three substrates and further description is not considered necessary.

Lamination of the three substrates of FIG. 6 is accomplished using conventional lamination equipment. In one embodiment, lamination is accomplished at a pressure within the range of from about 1700 PSI to about 2300 PSI for a total time period of about 300 minutes (5 hours). During this time period, the lamination temperature is raised from an initial ambient temperature of about 21.1 degrees Celsius (C.) to about 364.4 degrees C. in about 45 minutes and held at said elevated temperature for a period of about 125 minutes. The temperature is then decreased to about 260 degrees C. over a time period of about 100 minutes and then to a temperature of about 176.7 degrees C. over a period of the remaining minutes in the total time period defined above, after which it is dropped to the initial ambient temperature. This lamination procedure is deemed successful when laminating the substrates having the dielectric material and conductive paste defined above. Other temperatures, times and pressures will likely be required for alternative materials.

The three substrate embodiment shown in FIG. 6 is representative only and not meant to limit the invention. It is within the scope of this invention to combine several additional substrates, including utilizing two or more interconnecting substrates as shown in FIG. 5 in combination with four or more substrates of the type represented by substrates 53 and 55, to form other multilayered assemblies having many additional conductive layers and thus operational capabilities. These additional substrates may be, understandably, also formed using the unique methodology taught herein. For example, substrate 53 may be formed by laminating two high temperature dielectric layers onto the interim conductive layer 61 (following clearance opening formation, if desired) and the thru-holes 71 and 71' then formed to the desired depths as shown. The outer circuit layers can be formed using conventional photolithographic processing known in the PCB art in which an outer copper layer is covered with a suitable photo-resist, the resist is developed to expose a pattern, and the structure is then etched to remove undersired (exposed) copper to produce the desired pattern. Such processing is known, as stated, and further explanation is not considered necessary.

Figure 7:
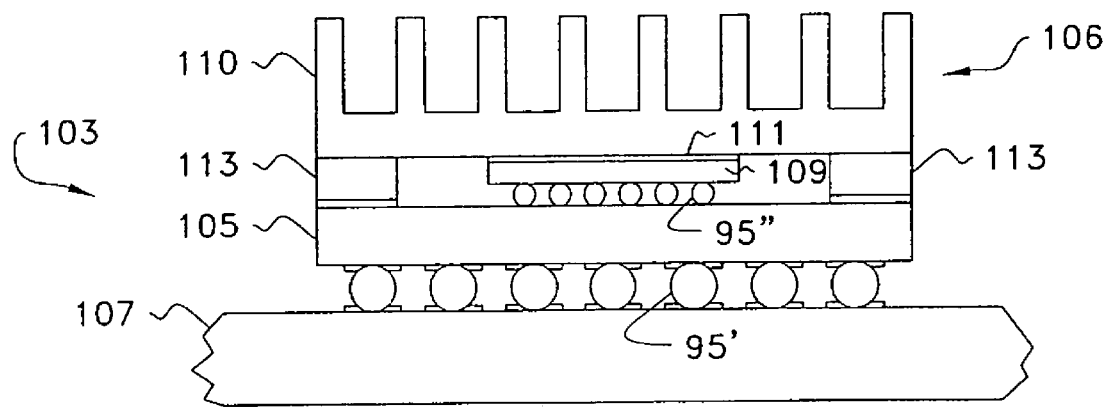
FIG. 7 is a side view of two examples of electrical assemblies which can utilize the circuitized substrates of the invention.

FIG. 7 represents examples of the multilayered circuitized substrate assemblies as taught herein in use within a larger electronic assembly 103. One assembly, referenced by the numeral 105, may form part of a larger chip carrier assembly 106, while the assembly represented by the numeral 107 may be a PCB, designed to have carrier assembly 106 positioned thereon and electrically coupled thereto. Therefore, each of the assemblies as taught herein may function in combination with other such assemblies and thus provide the enhanced connections taught herein for a much larger structure. Understandably, each assembly includes one or more of the circuitized substrates taught herein. For example, the substrate assembly 105 for carrier 106 may be of the construction of the assembly formed in FIG. 6. In the embodiment (assembly) of FIG. 7, the assembly 105 of chip carrier 106 is preferably mounted on and electrically coupled to PCB 107 using a plurality of solder balls 95' (preferably of conventional tin-lead composition), the chip carrier 106 in turn having a semiconductor chip 109 positioned thereon and electrically coupled to the upper portion of assembly 105 using a second plurality of solder balls 95" (also preferably of conventional tin-lead composition). In both cases, the outer pads (i.e., pads 65) may function as solder pads designed for having a solder ball positioned thereon and reflowed once in position. The upper pads of underlying PCB may provide a similar function to accommodate solder balls 95'. The chip carrier assembly 106 may also include a heat sink 110 thermally coupled to the chip 109, e.g., using a conductive paste 111, and positioned on the upper surface of the carrier by appropriate standoffs 113, as is known in the art. It is also within the scope of those skilled in the art to utilize an encapsulant material (not shown) to substantially encase the chip and also to possibly eliminate the need for the heat sink if such an encapsulant material is used. Encapsulant material is also possible about the lower pluralities of solder balls 95'. It is even further within the scope of the invention to couple chip 109 using conventional wire-bonding in which a plurality of fine wires (not shown) are bonded between chip conductor sites and corresponding conductor pads on the underlying substrate.

Figure 8:
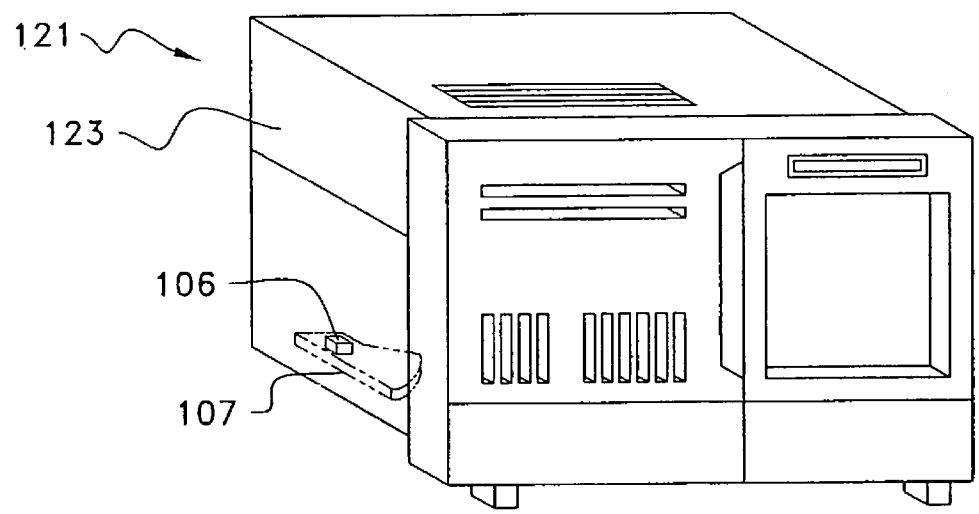
FIG. 8 is a perspective view of an information handling system adapted for using at least one circuitized substrate of the invention.

In FIG. 8, there is shown an information handling system 121 which is preferably a personal computer, a mainframe computer or a computer server. Other types of information handling systems known in the art of this type may also utilize the teachings of this invention. The circuitized substrate assemblies as formed in accordance with the teachings herein may be utilized in the system 121 as a PCB 107 (shown hidden) and/or a chip carrier 106 (also shown hidden). The circuitized substrate assemblies may be utilized as a mother board in system 121 or as one or more individual PCBs typically utilized in such systems. As is known, systems 121 are usually contained within a suitable metal or insulative housing such as shown by the numeral 123, with appropriate venting (if desired) therein, as well as instrumentation externally accessible for system operation by the system's designated operator. The remaining elements of information handling systems of these types are known in the art and further description is not believed necessary.

Thus there has been shown and described a method of making a circuitized substrate assembly in which highly effective electrical connections are made possible through the use of sintered metallic elements which form part of a low temperature conductive paste located within at least one of the assembly's circuitized substrates. Each includes, significantly, a high temperature dielectric material able to withstand such sintering without deformation. Such a multilayered substrate assembly may be utilized in such electronic structures as information handling systems. Such systems are thus able to benefit by the unique, advantageous features of this invention.

While there have been shown and described what are at present considered the preferred embodiments of the invention, it will be obvious to those skilled in the art that various changes and modifications may be made therein without departing from the scope of the invention as defined by the appended claims. The circuitized substrate assembly made in accordance with the teachings herein is capable of transmitting both regular and high speed (frequency) signals, the latter at a rate of from about one Gigabits/sec to about ten Gigabits/second, while substantially preventing impedance disruption.

It is also capable of utilizing many conventional PCB processes so as to assure reduced cost and facilitate ease of manufacture. That is, the defined method for assembling the circuitized substrate assembly may involve the use of conventional lamination processes, modified as taught herein, in which the high temperature dielectric layers, having the designated circuitry and/or conductive elements (planes) thereon or within, are "stacked up" in aligned manner with one another and subjected to relatively high pressures and temperatures for the defined time periods.

What is claimed is:

1. A method of making a multilayered circuitized substrate assembly, said method comprising:

providing a first circuitized substrate including at least one high temperature dielectric layer having first and second opposing surfaces and at least one opening within said at least one high temperature dielectric layer, extending from said opposing surface to said second opposing surface;

positioning a quantity of low temperature conductive paste within said at least one opening of said first circuitized substrate, said low temperature conductive paste including an organic binder component and at least one metallic component including a plurality of flakes; and bonding a second circuitized substrate including at least one high temperature dielectric layer to said first circuitized substrate by lamination over a time period of approximately 300 minutes and at a pressure within the range of from about 1700 PSI to about 2300 PSI, whereby said flakes within said low temperature conductive paste are sintered during said lamination process and are of sufficient density to form at least one electrical path through said paste, from said first opposing surface to said second opposing surface.

2. The method of claim 1 wherein, during said lamination, the lamination temperature is raised from an ambient temperature to a first predetermined temperature over a first predetermined time period and maintained at said first predetermined temperature for a second predetermined time period, following which said lamination temperature is lowered to a third predetermined temperature over a third predetermined time period and then further lowered to a fourth predetermined temperature over a fourth predetermined time period.

3. The method of claim 2 wherein said first predetermined time period is about 45 minutes, said first predetermined temperature is about 364.4 degrees C., said second predetermined time period is about 125 minutes, said third predetermined temperature is about 260 degrees C., said third predetermined time period is about 100 minutes, said fourth predetermined temperature is about 176.7 degrees C. and said fourth predetermined time period is the remaining minutes of said time period of approximately 300 minutes.

4. The method of claim 2 wherein said lamination temperature is lowered to an ambient temperature following said time period of approximately 300 minutes.

\* \* \* \* \*